(12) United States Patent
Fang et al.

(10) Patent No.: US 11,700,007 B2
(45) Date of Patent: Jul. 11, 2023

(54) DIGITAL-TO-ANALOG CONVERSION DEVICE AND METHOD

(71) Applicant: SHANGHAI CHENZHU INSTRUMENT CO., LTD., Shanghai (CN)

(72) Inventors: Xi Fang, Shanghai (CN); Gang Du, Shanghai (CN); Min Xu, Shanghai (CN)

(73) Assignee: SHANGHAI CHENZHU INSTRUMENT CO., LTD.

( * ) Notice: Subject to any disclaimer, the term of this patent is extended or adjusted under 35 U.S.C. 154(b) by 0 days.

(21) Appl. No.: 17/638,400

(22) PCT Filed: Mar. 15, 2021

(86) PCT No.: PCT/CN2021/080858
§ 371 (c)(1),
(2) Date: Feb. 25, 2022

(87) PCT Pub. No.: WO2022/165921
PCT Pub. Date: Aug. 11, 2022

(65) Prior Publication Data
US 2023/0118057 A1 Apr. 20, 2023

(30) Foreign Application Priority Data
Feb. 4, 2021 (CN) .......................... 202110166570.8

(51) Int. Cl.
*H03M 1/10* (2006.01)

(52) U.S. Cl.
CPC ................................. *H03M 1/1014* (2013.01)

(58) Field of Classification Search
CPC ........ H03M 1/68; H03M 1/1038; H03M 1/08; H03M 1/66; H03M 1/069; H03M 1/0863;
(Continued)

(56) References Cited

U.S. PATENT DOCUMENTS

| | | | |
|---|---|---|---|
| 4,465,996 A | * | 8/1984 | Boyacigiller ........... H03M 1/10 341/145 |
| 4,998,108 A | * | 3/1991 | Ginthner ................. H03M 1/68 341/145 |

(Continued)

FOREIGN PATENT DOCUMENTS

| | | |
|---|---|---|
| CN | 1633029 A | 6/2005 |
| CN | 101861702 B | 10/2013 |
| CN | 105471435 A | 4/2016 |

OTHER PUBLICATIONS

The State Intellectual Property Office of People's Republic of China, First Office Action, dated Jul. 21, 2022, for 202110166570.8.

(Continued)

*Primary Examiner* — Linh V Nguyen
(74) *Attorney, Agent, or Firm* — Design IP

(57) ABSTRACT

A digital-to-analog conversion device and method are provided. The control module is configured to split the input digital signal into n intermediate digital portions, divide the n intermediate digital portions by the corresponding conversion coefficients to obtain n intermediate digital signals and transmit the n intermediate digital signals to the n conversion modules. The n intermediate digital portions increase progressively. The conversion module is configured to perform digital-to-analog conversion on an intermediate digital signal to obtain a result including the conversion coefficient of the conversion module. The adder is configured to add output signals of the n conversion modules to obtain an analog signal. The feedback module is configured to obtain a feedback signal according to the analog signal. The control module is further configured to adjust the allocation of the n intermediate digital portions according to a target digital signal and the feedback signal.

10 Claims, 7 Drawing Sheets

(58) Field of Classification Search
CPC .... H03M 1/0872; H03M 1/10; H03M 1/1061; H03M 1/682; H03M 1/74; H03M 1/745; H03M 1/747; H03M 1/765; H03M 1/822
USPC .......................... 341/118, 119, 120, 121, 144
See application file for complete search history.

(56) References Cited

U.S. PATENT DOCUMENTS

| | | | | |
|---|---|---|---|---|
| 5,017,918 | A * | 5/1991 | Matsusako | H03M 1/0863 341/145 |
| 6,052,076 | A * | 4/2000 | Patton, III | H03M 1/68 375/238 |
| 6,822,595 | B1 * | 11/2004 | Robinson | H03M 1/70 341/143 |
| 6,995,700 | B2 * | 2/2006 | Roger | H03M 1/68 341/144 |
| 9,425,747 | B2 * | 8/2016 | Bazarjani | H03F 1/0222 |
| 9,590,648 | B2 * | 3/2017 | La Grou | H03M 1/08 |
| 9,998,826 | B2 * | 6/2018 | Satoskar | H04R 3/04 |
| 2002/0097811 | A1 * | 7/2002 | Kubo | H04L 5/06 375/296 |
| 2013/0015989 | A1 * | 1/2013 | Iso | H03M 1/1061 341/120 |

OTHER PUBLICATIONS

China National Intellectual Property Administration, The International Search Report, dated Oct. 29, 2021, for Internationa Application No. PCT/CN2021/080858.
China National Intellectual Property Administration, Written Opinion of the International Searching Authority, dated Nov. 11, 2021, for International Application No. PCT/CN2021/080858.

* cited by examiner

DIGITAL-TO-ANALOG CONVERSION DEVICE AND METHOD

This is a National Stage Application, filed under 35 U.S.C. 371, of International Patent Application No. PCT/CN2021/080858, filed on Mar. 15, 2021, which claims priority to Chinese Patent Application No. 202110166570.8 filed with the China National Intellectual Property Administration (CNIPA) on Feb. 4, 2021, the disclosures of which are incorporated herein by reference in their entireties.

TECHNICAL FIELD

The present application relates to the technical field of signal conversion, for example, to a digital-to-analog conversion device and method.

BACKGROUND

In isolation transmission of signals, industrial control systems often require a high-precision analog-to-digital converter (ADC) for signal acquisition and also require high resolution output voltages or currents (e.g., transmitters, safety barrier and isolator, etc.). That is, a high-precision digital-to-analog converter (DAC) is required.

There are generally two kinds of high-precision digital-to-analog (DA) output schemes. One is to output after pulse width modulation (PWM) filtering, with this scheme, the cost is low but the device performance is poor, the response is slow (it takes the order of hundreds of milliseconds to reach 99% and the order of second to reach 99.99%), the short-time fluctuation is large, and the linearity is poor. The other is to use a dedicated DAC chip for output, with this scheme, although the performance is good, the cost is high. Therefore, there is a contradiction between the cost and the performance of the digital-to-analog conversion device.

SUMMARY

A digital-to-analog conversion device and method are provided according to the present application, so that a high-precision output of the digital-to-analog conversion device is achieved at a low cost.

A digital-to-analog conversion device is provided and includes a control module, n conversion modules, an adder, and a feedback module. Each of the n conversion modules includes one conversion coefficient, n conversion coefficients included in the n conversion modules increase progressively; and n is an integer greater than or equal to 2.

The control module is electrically connected to the n conversion modules; the control module is configured to: split an input digital signal into n intermediate digital portions, divide each of the n intermediate digital portions by a conversion coefficient of a conversion module corresponding to the respective one of the n intermediate digital portions to obtain n intermediate digital signals, and transmit the n intermediate digital signals to the n conversion modules which are in one-to-one correspondence with the n intermediate digital signals; where the n intermediate digital portions increase progressively.

Each of the n conversion modules is configured to perform digital-to-analog conversion on an intermediate digital signal corresponding to the respective one of the n conversion modules, where a converted result of the intermediate digital signal includes the conversion coefficient of the respective conversion module.

The n conversion modules are each electrically connected to the adder; and the adder is configured to add up output signals of the n conversion modules to obtain an analog signal and output the analog signal.

The feedback module is configured to collect the analog signal and obtain a feedback signal according to the analog signal; and the control module is further configured to acquire the feedback signal and adjust allocation of the n intermediate digital portions according to a target digital signal and the feedback signal.

A digital-to-analog conversion method is further provided and includes the following steps.

An input digital signal is split into n intermediate digital portions by a control module of a digital-to-analog conversion device; each of the n intermediate digital portions is divided by a conversion coefficient of a conversion module, corresponding to the respective one of the n intermediate digital portions, of the digital-to-analog conversion device to obtain an intermediate digital signal; and n intermediate digital signals are transmitted to n conversion modules which are in one-to-one correspondence with the n intermediate digital signals respectively. The n intermediate digital portions increase progressively, and N is an integer greater than or equal to 2.

An intermediate digital signal corresponding to each of the n conversion modules is received by the respective one of the n conversion modules, and digital-to-analog conversion is performed according to the intermediate digital signal. Each of the n conversion modules includes one conversion coefficient, n conversion coefficients included in the n conversion modules increase progressively; and a converted result of the intermediate digital signal includes the conversion coefficient of the respective conversion module.

Output signals of the n conversion modules are added up by an adder of the digital-to-analog conversion device to obtain an analog signal.

The analog signal is collected by a feedback module of the digital-to-analog conversion device, and a feedback signal is obtained according to the analog signal.

The feedback signal is acquired by the control module, and allocation of the n intermediate digital portions is adjusted according to a target digital signal and the feedback signal.

DETAILED DESCRIPTION

The present application is described hereinafter in conjunction with drawings and embodiments.

Figure 1:
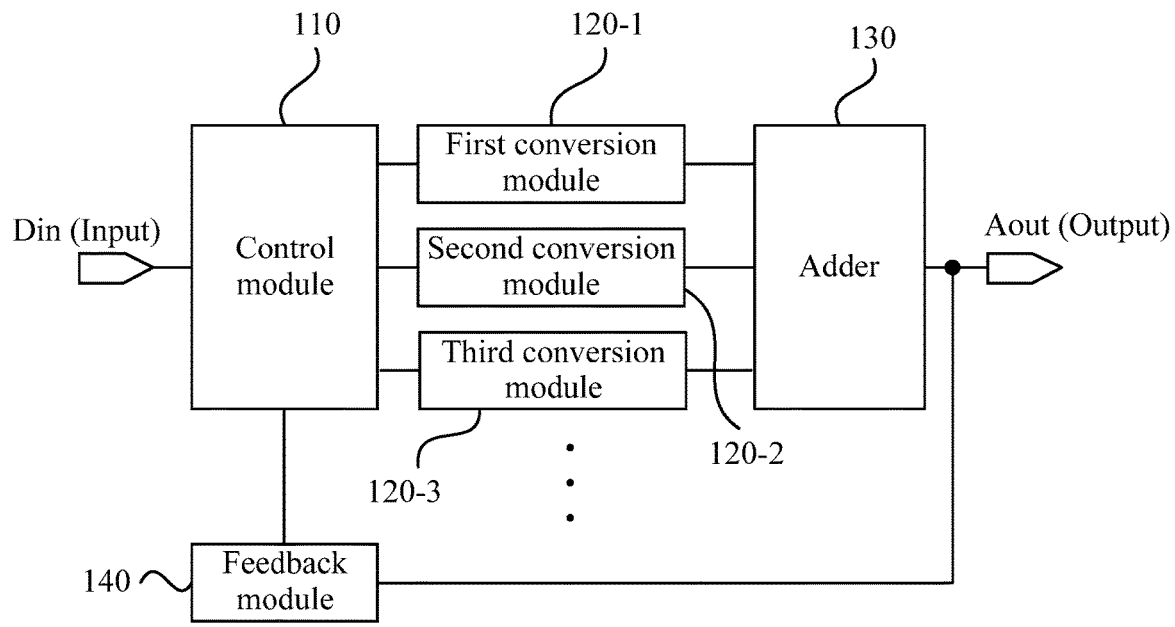
FIG. 1 is a schematic structural diagram of a high-precision digital-to-analog conversion device according to an embodiment of the present application.

A high-precision digital-to-analog conversion device is provided according to an embodiment of the present application. FIG. 1 is a schematic structural diagram of a high-precision digital-to-analog conversion device according to an embodiment of the present application. Referring to FIG. 1, the high-precision digital-to-analog conversion device includes a control module 110, n conversion modules 120 (three conversion modules are exemplary shown here as a first conversion module 120-1, a second conversion module 120-2, and a third conversion module 120-3, respectively), an adder 130, and a feedback module 140.

N is an integer greater than or equal to 2. Each of the conversion modules 120 includes one conversion coefficient, and n conversion coefficients increase progressively. The control module 110 is electrically connected to the n conversion modules 120. The control module 110 is configured to: split an input digital signal Din into n intermediate digital portions; divide each of the n intermediate digital portions by a conversion coefficient of the respective one of the n conversion modules 120 to obtain n intermediate digital signals; and transmit the n intermediate digital signals to the n conversion modules 120, respectively. The n intermediate digital portions increase progressively. Each conversion module 120 is configured to perform digital-to-analog conversion on an intermediate digital signal corresponding to the respective conversion module, and a converted result of the intermediate digital signal includes the conversion coefficient of the respective conversion module. The n conversion modules 120 are all electrically connected to the adder 130. The adder 130 is configured to add up output signals of all conversion modules 120 to obtain an analog signal Aout and output the analog signal Aout. The feedback module 140 is configured to collect the analog signal Aout and obtain a feedback signal according to the analog signal Aout. The control module 110 is further configured to acquire the feedback signal and adjust allocation of the intermediate digital portions according to a target digital signal and the feedback signal, thereby adjusting the analog signal Aout outputted by the device to implement the closed-loop control.

The working process of the high-precision digital-to-analog conversion device is as follows. The control module 110 receives an input digital signal Din, and splits the input digital signal Din into n intermediate digital portions increasing progressively according to the number of the subsequently connected conversion modules 120 and respective resolutions of the conversion modules 120. In order to meet the conversion capacity of the n conversion modules 120, the control module 110 first reduces the multiple intermediate digital portions according to conversion coefficients (represented by K1, K2, . . . , and Kn, where the coefficients K1 to Kn increase progressively) of the corresponding conversion modules 120 to form n intermediate digital signals (represented by D1, D2, . . . , and Dn), and then transmits the n intermediate digital signals to the n conversion modules 120, respectively. The n conversion modules 120 first perform digital-to-analog conversion on the intermediate digital signals to form converted analog signals (represented by A1, A2, . . . , and An), then amplify the converted analog signals according to the conversion coefficients to form intermediate analog signals including the conversion coefficients (i.e., K1*A1, K2*A2, . . . , and Kn*An), and transmit the intermediate analog signals to the adder 130. The output signals of all conversion modules 120 are summed in the adder 130 and integrated into an analog signal Aout for output. The analog signal Aout may be represented as Aout=K1*A1+K2*A2+ . . . +Kn*An.

In an embodiment, the above conversion coefficients are determined by hardware as fixed values. However, the values of the above conversion coefficients are not very accurate and may only be used for reference. In addition, the low-resolution conversion modules 120 have a low original precision. Although in the above conversion process, all information of the input digital signal Din is retained as much as possible, and the accuracy of the output analog signal Aout can be hardly ensured.

Therefore, the control module 110 determines a target digital signal corresponding to the input digital signal according to the format of an output signal of the feedback module 140. The feedback module 140 collects the analog signal Aout, forms a feedback signal, and transmits the feedback signal to the control module 110. The control module 110 adjusts, according to the difference between the target digital signal and the feedback signal, the allocation of the intermediate digital portions by means of algorithm control (such as proportion integral differential (PID) adjustment), so as to adjust the output analog signal Aout. The feedback signal is gradually approximated to the target digital signal by multiple times of adjustment, which represents that the output analog signal Aout is gradually approximated to the target value to improve the conversion precision.

The high-precision digital-to-analog conversion device according to the embodiment of the present application is provided with the control module 110, the multiple conversion modules 120, and the adder 130. The input digital signal Din is split by the control module 110 into multiple intermediate digital signals, and the multiple intermediate digital signals are reduced in accordance with the conversion coefficients respectively and then are allocated to the multiple conversion modules 120. The multiple conversion modules 120 perform digital-to-analog conversion on the intermediate digital signals and amplify the converted analog signals in accordance with the conversion coefficients, then the formed output signals are summed by the adder 130 and re-integrated into one analog signal for output. Thus, the n conversion modules 120 which originally have the low resolution may process the input digital signal Din with more bits after being combined so that the high resolution conversion is achieved on a lower cost basis. Further, by increasing the multiple conversion coefficients progressively, the information in the input digital signal Din can be effectively retained without losing information of less significant bits relative to the entire input digital signal Din, thereby ensuring the conversion precision as far as possible. Moreover, the feedback module 140 is provided according to the embodiment of the present application, which converts the output analog signal Aout into a feedback signal and transmits the feedback signal to the control module 110. The control module 110 may adjust the allocation of the intermediate digital portions according to the feedback signal to form the closed-loop control. The feedback signal is re-acquired after each allocation, and the feedback signal is gradually approximated to the target digital signal by multiple times of adjustment to reduce jitter of the output result, and improve the conversion precision and linearity. Therefore, with the embodiment of the present application, a high-precision output of the digital-to-analog conversion device can be realized on the basis of ensuring a low cost.

Figure 2:
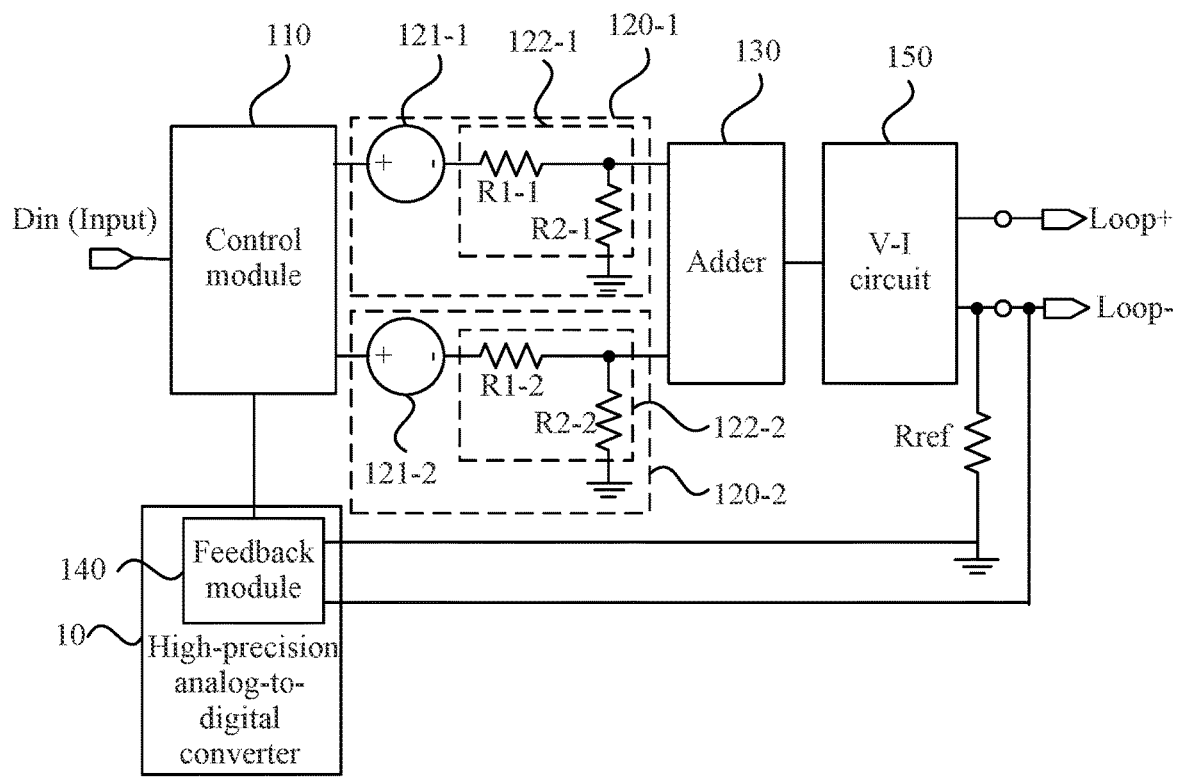
FIG. 2 is a schematic structural diagram of another high-precision digital-to-analog conversion device according to an embodiment of the present application.

FIG. 2 is a schematic structural diagram of another high-precision digital-to-analog conversion device according to an embodiment of the present application. Referring to FIG. 2, on the basis of the above-described embodiment, when a current is required to be output, the high-precision digital-to-analog conversion device further includes a V-I circuit 150 connected to the adder 130, and the V-I circuit 150 is configured to convert an analog signal (voltage signal) output by the adder 130 into a current signal output.

For example, the V-I circuit 150 has two output signals, one is Loop+ and the other is Loop−, to form a current loop. One input terminal of the feedback module 140 may be connected to the current signal via a sampling resistor Rref, and the other input terminal may be directly connected to the current signal to implement collection of the current signal. When the feedback module 140 needs to collect a voltage signal, the input terminal of the feedback module 140 may also be electrically connected directly to an output terminal of the adder 130.

Referring to FIG. 2, on the basis of the above-described embodiment, the feedback module 140 may be integrated into a high-precision analog-to-digital converter 10 and is configured to employ redundant resources of the high-precision analog-to-digital converter 10. Therefore, the implementation of the feedback module 140 does not require additional device costs to ensure a low cost of the high-precision digital-to-analog conversion device.

The working process of the feedback module 140 is as follows. The control module 110 obtains a target analog signal according to the digital input signal Din and obtains a target digital signal corresponding to the target analog signal according to the target analog signal and a code-value conversion relationship of the high-precision analog-to-digital converter 10 (for example, a linear relationship between input signals and output signals of the high-precision analog-to-digital converter 10 obtained by the two-point calibration method). In this way, since the precision of the feedback module 140 is sufficiently high, when the feedback signal is close to the target digital signal, it represents that the output analog signal is close to a desired target output value, thus ensuring the precision of the digital-to-analog conversion device.

Alternatively, the high-precision digital-to-analog conversion device may be applied to various control systems such as a temperature control system, a communication system. In these application scenarios, the high-precision analog-to-digital converter 10 generally has a surplus of resources in hardware. Therefore, the feedback module 140 employing the surplus resources of the high-precision analog-to-digital converter 10 can ensure a high performance-to-cost ratio of the high-precision digital-to-analog conversion device.

For example, in a case where the high-precision digital-to-analog conversion device is applied to the temperature control system, the high-precision analog-to-digital converter 10 is equipped in the temperature control system due to the requirement for AD sampling in the temperature control system. However, it is unnecessary for all resources of the high-precision analog-to-digital converter 10 to be used for temperature sampling in real time, and the feedback module 140 may be activated in the gap in which the high-precision analog-to-digital converter 10 does not perform the temperature sampling, such that the feedback module 140 is set as feedback adjustment for the high-precision digital-to-analog conversion device. When the feedback module 140 is not working, due to no temperature change and no temperature control requirement, the output of the high-precision digital-to-analog conversion device is unchanged; alternatively, the high-precision digital-to-analog conversion device performs temperature adjustment according to an adjustment method determined at the last time of working of the feedback module 140, thereby the effect on the output of the entire control system is not significant. Moreover, since the sampling frequency is generally high in a control system requiring the high-precision analog-to-digital converter 10, the feedback module 140 is activated at very short time intervals (such as the order of milliseconds or less). Therefore, the redundant resources of the high-precision analog-to-digital converter 10 are used to implement the function of the feedback module 140, and the conversion capacity and efficiency of the high-precision digital-to-analog conversion device are not adversely affected.

Referring to FIG. 2, on the basis of the above-described embodiment, the conversion module 120 may include DA conversion units 121 (two DA conversion units 121 are exemplified here, namely, a first DA conversion unit 121-1 and a second DA conversion unit 121-2, respectively) and coefficient units 122 (two coefficient units 122 are exemplified here accordingly, a first coefficient unit 122-1 and a second coefficient unit 122-2, respectively).

The input terminal of the DA conversion unit 121 is electrically connected to the control module 110, and the DA conversion unit 121 is configured to perform the digital-to-analog conversion on the intermediate digital signal to obtain an intermediate analog signal. The output terminal of the DA conversion unit 121 is electrically connected to the coefficient unit 122, and the coefficient unit 122 contains a conversion coefficient and is configured to multiply the intermediate analog signal by the conversion coefficient, thereby realizing the conversion function of the conversion module 120.

In an embodiment, both the DA conversion unit 121 and the control module 110 may be integrated within a microcontroller unit (MCU). That is, the DA conversion unit 121 may be a DAC provided by the MCU. Since the DA conversion unit 121 has a low resolution (for example, 10 bits or 12 bits) and poor output linearity, poor stability and temperature drift performance of output reference, the requirements for signal output of the industrial system cannot be satisfied; therefore the feedback module 140 is required accordingly for improving the precision.

Exemplarily, the process of splitting the input digital signal Din by the control module 110 is explained as follows by taking FIG. 2 as an example. Assuming that the two DA conversion units 121 are the same, the values represented by the least significant bits of the two intermediate digital signals are the same. The control module 110 may split the input digital signal Din according to the number of bits, extract less significant several-bit digital signal as a first intermediate digital signal to allocate to the first DA conversion unit 121-1, and extract more significant several-bit digital signal as a second intermediate digital signal to allocate to the second DA conversion unit 121-2.

Referring to FIG. 2, on the basis of the above-described embodiment, the coefficient unit 122 may include a first resistor R1 and a second resistor R2 (two coefficient units 122 are exemplarily given here, the first coefficient unit 122-1 includes a first first resistor R1-1 and a first second resistor R2-1, and the second coefficient unit 122-2 includes a second first resistor R1-2 and a second second resistor R2-2). A first terminal of the first resistor R1 is electrically connected to the DA conversion unit 121, and a second terminal of the first resistor R1 is electrically connected to the adder 130. A first terminal of the second resistor R2 is electrically connected to the second terminal of the first resistor R1, and a second terminal of the second resistor R2 is grounded.

The first resistor R1 and the second resistor R2 constitute a voltage dividing unit, and different conversion coefficients may be formed by controlling the resistance ratio of the first resistor R1 to the second resistor R2.

Figure 3:
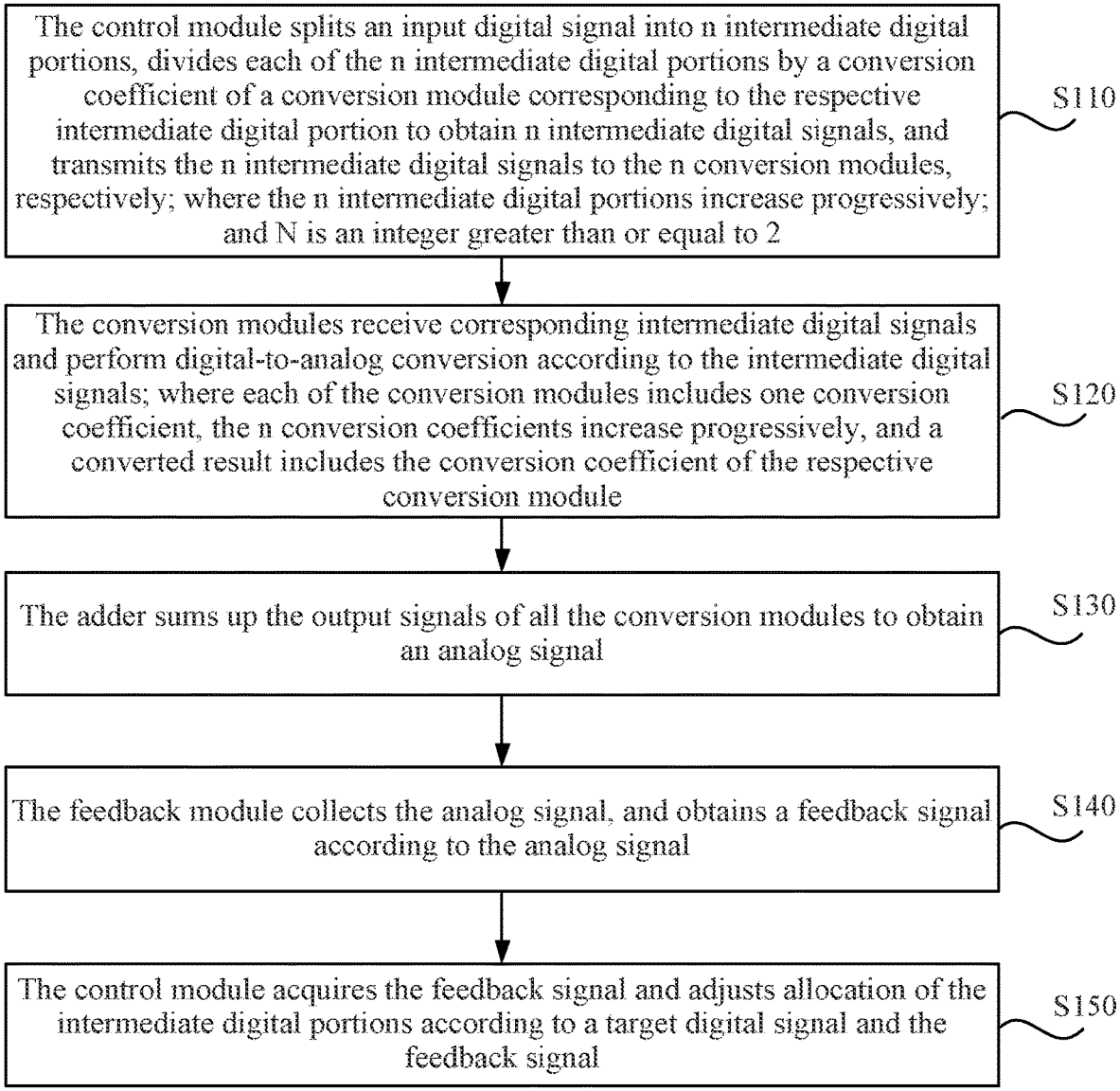
FIG. 3 is a schematic flowchart of a high-precision digital-to-analog conversion method according to an embodiment of the present application.

A high-precision digital-to-analog conversion method is further provided according to an embodiment of the present application, and the high-precision digital-to-analog conversion method is applicable to the high-precision digital-to-analog conversion device according to any embodiment of the present application and has corresponding effects to the high-precision digital-to-analog conversion device. FIG. 3 is a schematic flowchart of a high-precision digital-to-analog conversion method according to an embodiment of the present application. Referring to FIG. 3, the high-precision digital-to-analog conversion method includes the following steps.

In S110, an input digital signal is split into n intermediate digital portions by the control module; and each of the n intermediate digital portions is divided by a conversion coefficient of a conversion module corresponding to the respective intermediate digital portion to obtain n intermediate digital signals; and the n intermediate digital signals are transmitted to the n conversion modules, respectively; where the n intermediate digital portions increase progressively, and N is an integer greater than or equal to 2.

The control module splits, according to the number of conversion modules and respective resolutions of the conversion modules, the input digital signal into n intermediate digital portions that increase progressively. In order to meet the conversion capacity of the conversion modules, the control module first reduces the multiple intermediate digital portions according to the conversion coefficients of the respective conversion modules to form n intermediate digital signals, and then transmits the n intermediate digital signals to the conversion modules, respectively.

In S120, the conversion modules receive corresponding intermediate digital signals and perform digital-to-analog conversion according to the intermediate digital signals; where each of the conversion modules includes one conversion coefficient, and the n conversion coefficients increase progressively. A converted result of the intermediate digital signal includes the conversion coefficient of the respective conversion module.

In an embodiment, the conversion module includes a DA conversion unit and a coefficient unit. The conversion process of the conversion module is as follows. The DA conversion unit performs the digital-to-analog conversion on an intermediate digital signal to obtain an intermediate analog signal. The coefficient unit includes a conversion coefficient and is configured to multiply the intermediate analog signal by the conversion coefficient to obtain a converted analog signal.

In S130, the adder sums up output signals of all the conversion modules to obtain an analog signal.

The analog signal may be a voltage signal; and when it is required to output a current signal, a V-I circuit may be used to convert the analog signal into a current signal and output the converted current signal.

In S140, the feedback module collects the analog signal and obtains a feedback signal according to the analog signal.

The feedback module is integrated into a high-precision analog-to-digital converter and is configured to employ redundant resources of the high-precision analog-to-digital converter in a control system to reduce the cost of the digital-to-analog conversion device.

In S150, the control module acquires the feedback signal and adjusts allocation of the intermediate digital portions according to a target digital signal and the feedback signal.

The control module determines the target digital signal corresponding to the input digital signal according to the format of an output signal of the feedback module. The feedback module collects an analog signal, forms a feedback signal, and transmits the feedback signal to the control module. The control module adjusts the allocation of the intermediate digital portions according to the difference between the target digital signal and the feedback signal, thereby realizing adjustment to the output analog signal. The feedback signal is gradually approximated to the target digital signal by multiple times of adjustment, representing that the output analog signal is gradually approximated to the target value to improve the conversion precision.

Figure 4:
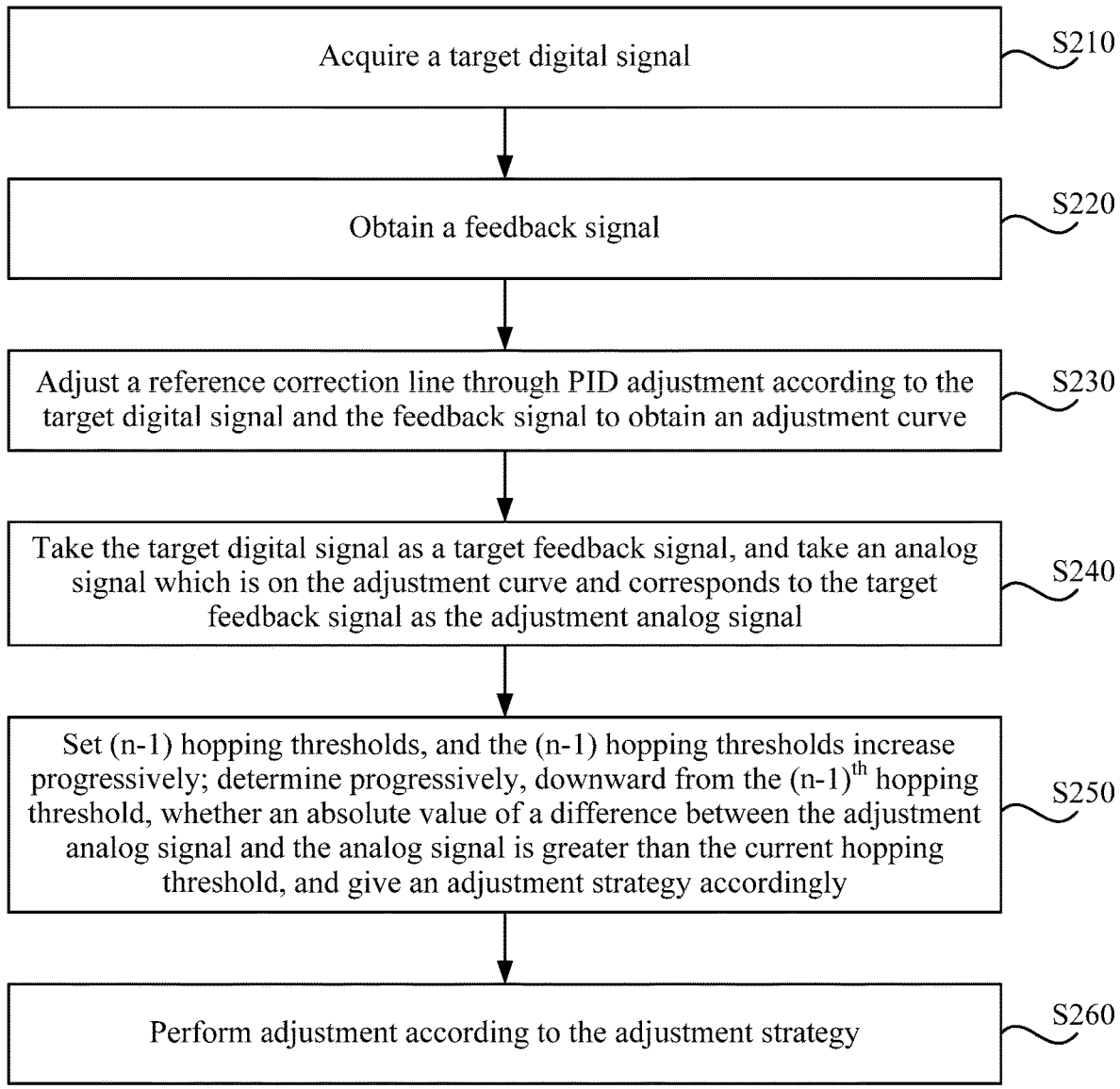
FIG. 4 is a schematic flowchart of another high-precision digital-to-analog conversion method according to an embodiment of the present application.

FIG. 4 is a schematic flowchart of another high-precision digital-to-analog conversion method according to an embodiment of the present application. Referring to FIG. 4, the operation of the control module throughout the adjustment process includes the following steps.

In S210, a target digital signal is acquired.

Figure 5:
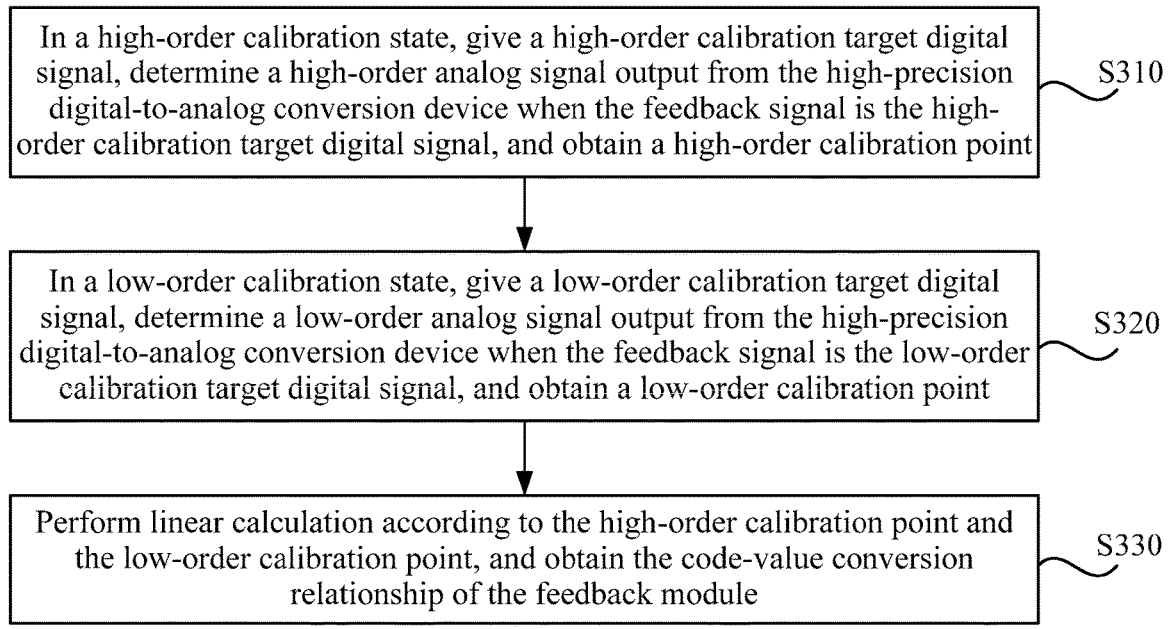
FIG. 5 is a schematic flowchart illustrating acquisition of a code-value conversion relationship of a feedback module according to an embodiment of the present application.

The format of the target digital signal matches the format of the output signal of the feedback module. The control module may obtain a target digital signal according to the input digital signal. The feedback module may be configured to employ redundant resources of a high-precision analog-to-digital converter in a control system, and the control module may calculate the target digital signal according to a code-value conversion relationship of the feedback module. The code-value conversion relationship of the feedback module is just the code-value conversion relationship of the high-precision analog-to-digital converter. The code-value conversion relationship may be obtained by two-point calibration for linear calculation. The steps of calculating the code-value conversion relationship are illustrated in FIG. 5. The steps are explained in the embodiment hereinafter and are not described in detail here.

In S220, a feedback signal is obtained.

The control module collects the feedback signal outputted by the feedback module; and the format of the feedback signal matches the format of the target digital signal.

In S230, a reference correction line is adjusted through PID adjustment according to the target digital signal and the feedback signal to obtain an adjustment curve.

The adjustment curve is obtained by the following steps.

The high-precision digital-to-analog conversion device is controlled to output a first analog signal; the feedback module collects the first analog signal to obtain a first feedback signal; and a first coordinate point composed of the first analog signal and the first feedback signal is established.

The high-precision digital-to-analog conversion device is controlled to output a second analog signal; the feedback module collects the second analog signal to obtain a second feedback signal;

and a second coordinate point composed of the second analog signal and the second feedback signal is established.

The reference correction line is obtained according to the first coordinate point and the second coordinate point.

According to the target digital signal and the feedback signal, the reference correction line is adjusted in the PID-adjustment manner to form the adjustment curve.

Alternatively, there are multiple manners of adjusting the reference correction line by the PID adjustment, several of those manners are described hereinafter, but should not be deemed as limitations to the present application.

In an embodiment, a fixed coordinate point and a float coordinate point on the extension of the reference correction line may be taken. The PID adjustment is applied to the float coordinate point, and the slope of the adjustment curve is adjusted by adjusting the coordinate of the float coordinate point to obtain an adjustment analog signal.

Figure 6:
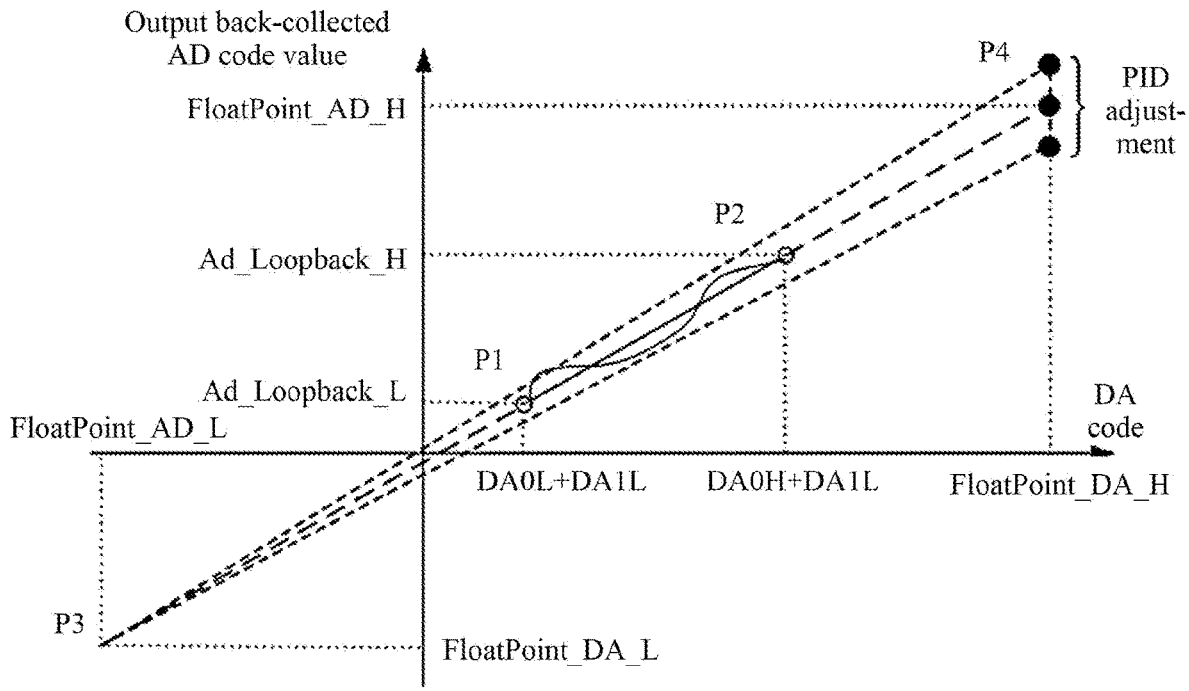
FIG. 6 is a schematic diagram of an adjustment curve according to an embodiment of the present application.

Referring to FIG. 2 and FIG. 6, the high-precision digital-to-analog conversion device including two conversion modules 120 is taken as an example, the signal output by the first conversion module 120-1 is denoted by DA1, and the signal output by the second conversion module 120-2 is denoted by DA0. The process of obtaining the adjustment curve is as follows.

The DA code output by the conversion module 120 is used as the abscissa, and the feedback signal of the feedback module 140 (an output back-collected AD code value) is used as the ordinate to establish the coordinate system.

The first conversion module 120-1 is controlled to output a signal DA1L having a relatively low signal value, and the second conversion module 120-2 is controlled to output a signal DA0L having a relatively low signal value. In this case, the feedback signal obtained by the feedback module 140 collecting the output signals is Ad_loopback_L, thereby obtaining a first coordinate point P1 (DA0L+DA1L, Ad_loopback_L).

The first conversion module 120-1 is controlled to output a signal DA1L having a relatively low signal value, and the second conversion module 120-2 is controlled to output a signal DA0H having a relatively high signal value. In this case, the feedback signal obtained by the feedback module 140 collecting the output signals is Ad_loopback_H, thereby obtaining a second coordinate point P2 (DA0H+DA1L, Ad_loopback_H).

Only the output signal of the second conversion module 120-2 is changed because the second conversion module 120-2 includes a relatively large conversion coefficient, changing the output of the second conversion module 120-2 may cause the distance between the first coordinate point P1 and the second coordinate point P2 to be larger, and a larger distance represents a larger range. It is more reasonable that the reference correction line thus determined serves as an initial reference for adjustment. Meanwhile, since the output values of the first conversion module 120-1 and the second conversion module 120-2 cannot be accurately controlled, when only the output of the second conversion module 120-2 is changed, the number of variables may be reduced. In an embodiment, the signal DA1L having the relatively low signal value output by the first conversion module 120-1, the signal DA0L having the relatively low signal value output by the second conversion module 120-2, and the signal DA0H having the relatively high signal value output by the second conversion module 120-2 may be written in software as fixed values.

By extending to the left (the third quadrant) along the reference correction line, a third coordinate point P3 (Float-Point_DA_L, FloatPoint_AD_L) is determined as a fixed coordinate point. By extending to the right (the first quadrant) along the reference correction line, a fourth coordinate point P4 (FloatPoint_DA_H, FloatPoint_AD_H) is determined as a float coordinate point. The third coordinate point P3 and the fourth coordinate point P4 cannot be set too close to each other so as to prevent the adjustment sensitivity from being insufficient, while the third coordinate point P3 and the fourth coordinate point P4 cannot be set too far from each other so as to avoid merely the relatively large adjustment to be performed for achieving the adjustment effect. In summary, the position of the ordinate of the float coordinate point P4 is adjusted by the PID adjustment, and the float coordinate point P4 and the fixed coordinate point P3 are connected to form the adjustment curve.

In another embodiment, a float coordinate point on the extension of the reference calibration line may be taken; the slope of the reference correction line is taken as a fixed slope, the PID adjustment is applied to the float coordinate point, and the adjustment curve is obtained by moving the reference correction line up and down to obtain an adjustment analog signal.

Figure 7:
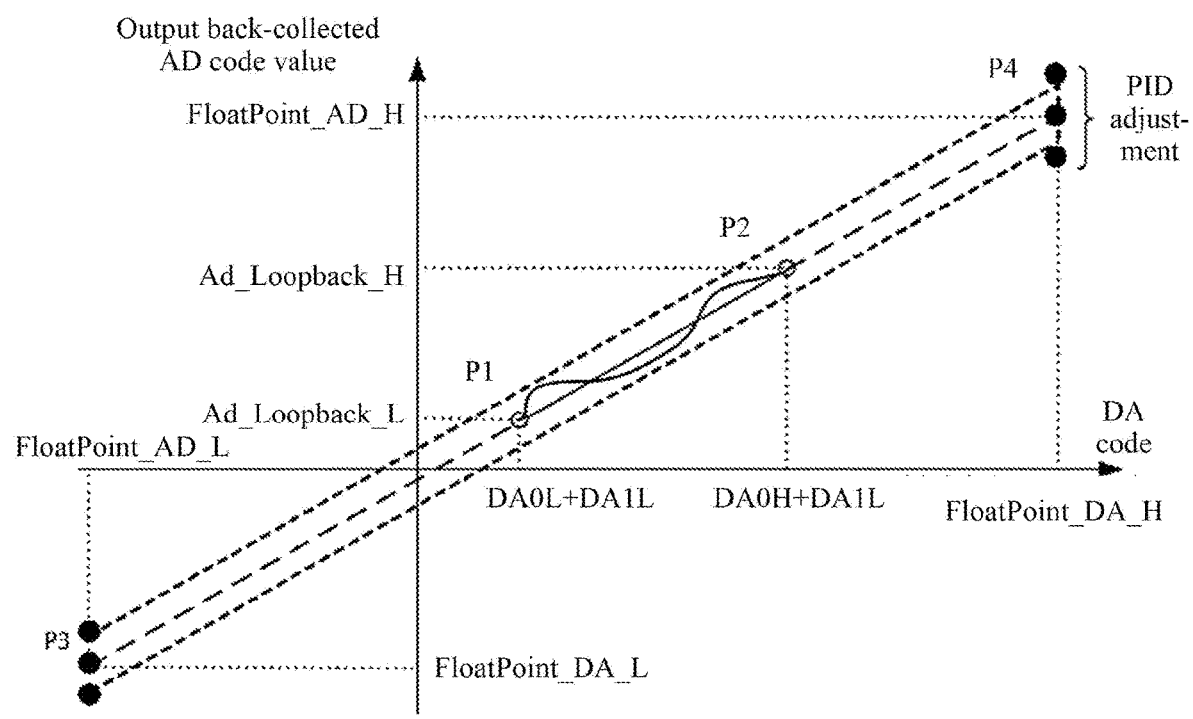
FIG. 7 is a schematic diagram of another adjustment curve according to an embodiment of the present application.

With reference to FIG. 2 and FIG. 7, the high-precision digital-to-analog conversion device including two conversion modules 120 is still taken as an example, and the reference correction line is acquired in the same manner as the process shown in FIG. 6, and the details of the manner are not repeated here. The difference therebetween lies in that the third coordinate point P3 is also changed to be a float coordinate point. During the adjustment, the change amount of the third coordinate point P3 is the same as the change amount of the fourth coordinate point P4 to ensure that the slope of the adjustment curve remains unchanged.

In describing each of the above-described embodiments, the reference correction line defined by two coordinate points as a straight line is taken as an example, but should not be deemed as a limitation to the present application. In other embodiments, multiple reference coordinate points may also be taken to form a polyline-type reference correction line. Alternatively, the reference correction line is fitted to obtain a smooth curve. Similarly, the above-described methods of obtaining the adjustment curve are also not deemed as the limitation to the present application. In other embodiments, the third coordinate point P3 and the fourth coordinate point P4 may be moved in different directions, and there may be an adjustment amount on the abscissa, or the adjustment may be performed in a manner other than the PID adjustment.

In S240, the target digital signal is taken as a target feedback signal, and an analog signal which is on the adjustment curve and corresponds to the target feedback signal is taken as the adjustment analog signal.

Exemplarily, with reference to FIG. 2 and FIG. 6, assuming that the curve in FIG. 6 is an actual output curve, after the ordinate of the float coordinate point P4 is adjusted by the PID adjustment according to the difference between the target digital signal and the feedback signal to form the adjustment curve, the target digital signal is used as the target output back-collected AD code value of the vertical axis, and the abscissa DA code corresponding to this ordinate on the adjustment curve is found as the adjustment analog signal. The control module 110 reallocates the intermediate digital portions with reference to this value.

In S250, (n−1) hopping thresholds are set, and the (N−1) hopping thresholds increase progressively; it is determined progressively, downward from the $(n-1)^{th}$ hopping threshold, whether an absolute value of a difference between the adjustment analog signal and the analog signal is greater than the current hopping threshold, and an adjustment strategy is given accordingly.

Figure 8:
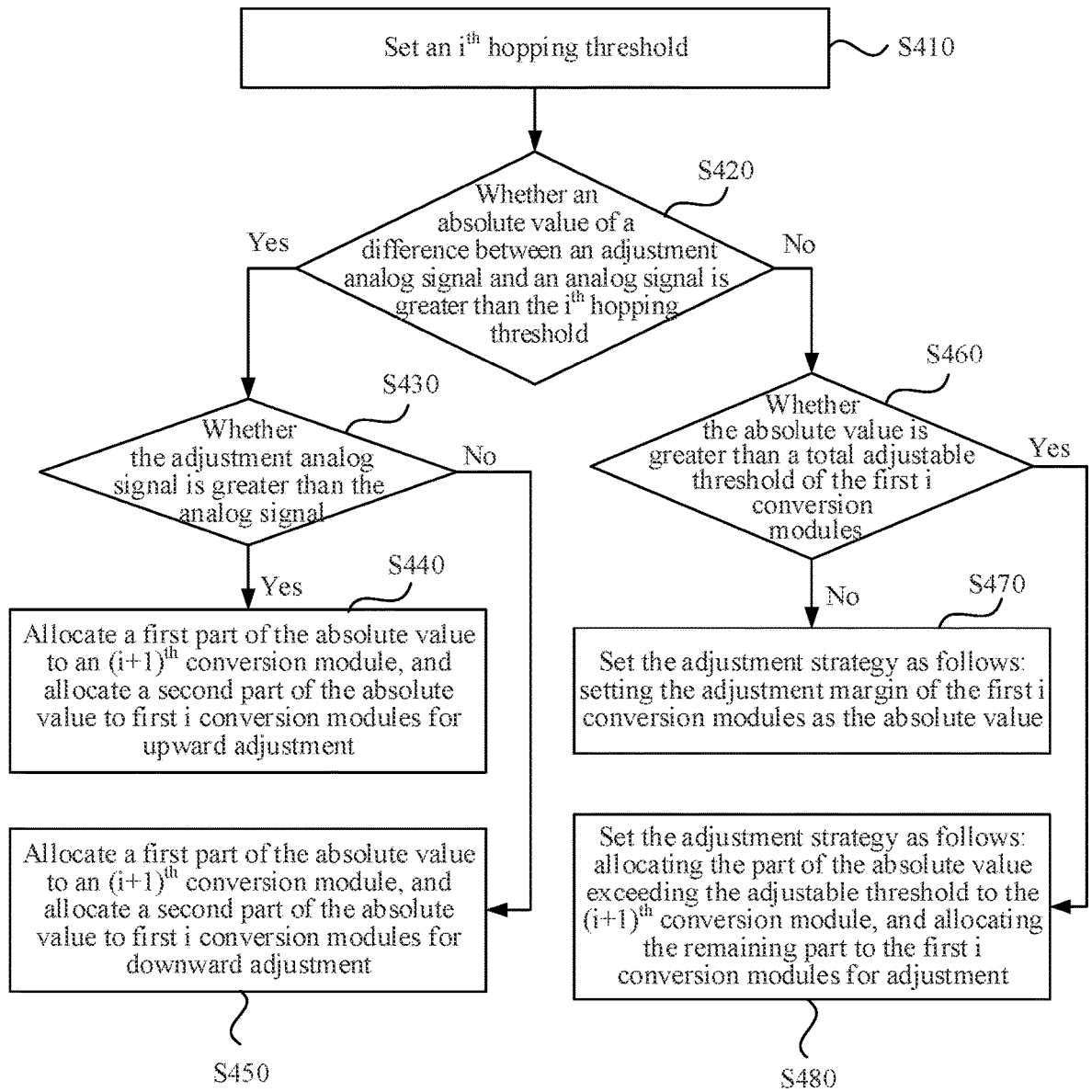
FIG. 8 is a schematic flowchart illustrating acquisition of an adjustment strategy according to an embodiment of the present application.

The forming process of the adjustment strategy is as shown in FIG. 8, and the steps are explained in the following embodiment, and are not described in detail here.

In S260, adjustment is performed according to the adjustment strategy.

The control module reallocates the input digital signal to adjust the output. In the next period, the adjustment curve is modified according to the comparison of the feedback signal of the feedback module with the target digital signal, the adjustment analog signal is calculated again, and the adjustment strategy is formed and output again. In this manner, the process repeats cycle after cycle. In an embodiment, the output of one input digital signal may be adjusted over multiple periods.

FIG. 5 is a schematic flowchart illustrating acquisition of a code-value conversion relationship of a feedback module according to an embodiment of the present application. Referring to FIG. 5, the acquisition of the code-value conversion relationship includes the following steps.

In S310, in a high-order calibration state, a high-order calibration target digital signal (denoted as Ad_H) is given, the high-precision digital-to-analog conversion device is determined to output a high-order analog signal (denoted as I_H) when the feedback signal is the high-order calibration target digital signal, and a high-order calibration point, i.e., (I_H, Ad_H) is obtained.

In S320, in a low-order calibration state, a low-order calibration target digital signal (denoted as Ad_L) is given, the high-precision digital-to-analog conversion device is determined to output a low-order analog signal (denoted as I_L) when the feedback signal is the low-order calibration target digital signal, and a low-order calibration point, i.e., (I_L, Ad_L) is obtained.

In this way, two reference points are obtained from the above two steps, and the sequence of the above two steps may be adjusted according to requirements.

In S330, linear calculation is performed according to the high-order calibration point and the low-order calibration point to obtain the code-value conversion relationship of the feedback module.

The above two-point calibration steps may be performed before the high-precision analog-to-digital converter is delivered from the factory. When the analog-to-digital conversion device is used, the calibration points are used for the linear calculation to obtain a target digital signal for target adjustment. The target of dynamic adjustment is to stabilize the feedback signal in the vicinity of the target digital signal by adjusting the output.

FIG. 8 is a schematic flowchart illustrating acquisition of an adjustment strategy according to an embodiment of the present application. Referring to FIG. 8, the process of comparing an absolute value of a difference between an adjustment analog signal and an analog signal with an $i^{th}$ hopping threshold is taken as an example, where $1 \leq i \leq (n-1)$; the acquisition flow of the adjustment strategy includes the following steps.

In S410, an $i^{th}$ hopping threshold is set.

The total number of hopping thresholds is (n−1), the (n−1) hopping thresholds may be determined and written into the program before the device is used, and may also be adjusted at each comparison.

In S420, it is determined whether the absolute value of the difference between the adjustment analog signal and the analog signal is greater than the $i^{th}$ hopping threshold; if the absolute value of the difference between the adjustment analog signal and the analog signal is greater than the $i^{th}$ hopping threshold, S430 is performed; and if the absolute value of the difference between the adjustment analog signal and the analog signal is not greater than the $i^{th}$ hopping threshold, S460 is performed.

According to the foregoing, the conversion coefficient of each conversion module depends on the hardware circuit, and theoretical calculation value may only be used for reference and not accurate. The conversion coefficients are primarily used for "carrying" between two adjacent conversion modules, and an overflow may occur in the output when the intermediate digital portions are reallocated due to inaccuracy of the conversion coefficients. Therefore, it is necessary to set the hopping thresholds to classify the overflow situations and perform a overflow reduction process according to the classification.

In S430, it is determined whether the adjustment analog signal is greater than the analog signal; and if the adjustment analog signal is greater than the analog signal, S440 is performed; and if the adjustment analog signal is not greater than the analog signal, S450 is performed.

The adjustment analog signal may be greater or less than the analog signal; when the adjustment analog signal is greater than the analog signal, it needs to be adjusted upward entirely; and when the adjustment analog signal is less than the analog signal, it needs to be adjusted downward entirely.

In S440, a first part of the absolute value is allocated to an $(i+1)^{th}$ conversion module, and a second part of the absolute value is allocated to the first i conversion modules for upward adjustment.

The first part and the second part of the absolute value constitute the entire absolute value. The allocation of the first part and the second part is performed according to the adjustment headroom of each conversion module. Because the conversion coefficients are not accurate, there may also be errors in the correction result. Therefore, after adjustment according to the absolute value is completed, the feedback signal may be collected again and the adjustment toward the target digital signal in this period may be performed again.

In S450, a first part of the absolute value is allocated to the $(i+1)^{th}$ conversion module and a second part of the absolute value is allocated to the first i conversion modules for downward adjustment.

The process in S450 is exactly the opposite process of S440, and the details are not repeated here.

In S460, it is determined whether the absolute value is greater than a total adjustable threshold of the first i conversion modules; if the absolute value is greater than the total adjustable threshold of the first i conversion modules, S480 is performed; and if the absolute value is not greater than the total adjustable threshold of the first i conversion modules, S470 is performed.

When the absolute value is less than the $i^{th}$ hopping threshold, it may be considered as a slow change. Adjustment is required to be performed on the first i conversion modules as far as possible. However, when the absolute value is greater than the total adjustable threshold of the first i conversion modules, it represents that the adjustment capacity of the first i conversion modules is insufficient, and the excess portion needs to be carried to the $(i+1)^{th}$ conversion module for adjustment.

In S470, the adjustment strategy is set as that the total adjustment amount for the first i conversion modules is set to the absolute value.

In S480, the adjustment strategy is set as follows, the part of the absolute value exceeding the adjustable threshold is allocated to the $(i+1)^{th}$ conversion module, and the remaining part is allocated to the first i conversion modules for adjustment.

Likewise, when the adjustment analog signal is greater than the analog signal, it needs to be adjusted upward entirely; and when the adjustment analog signal is less than the analog signal, it needs to be adjusted downward entirely.

Figure 9:
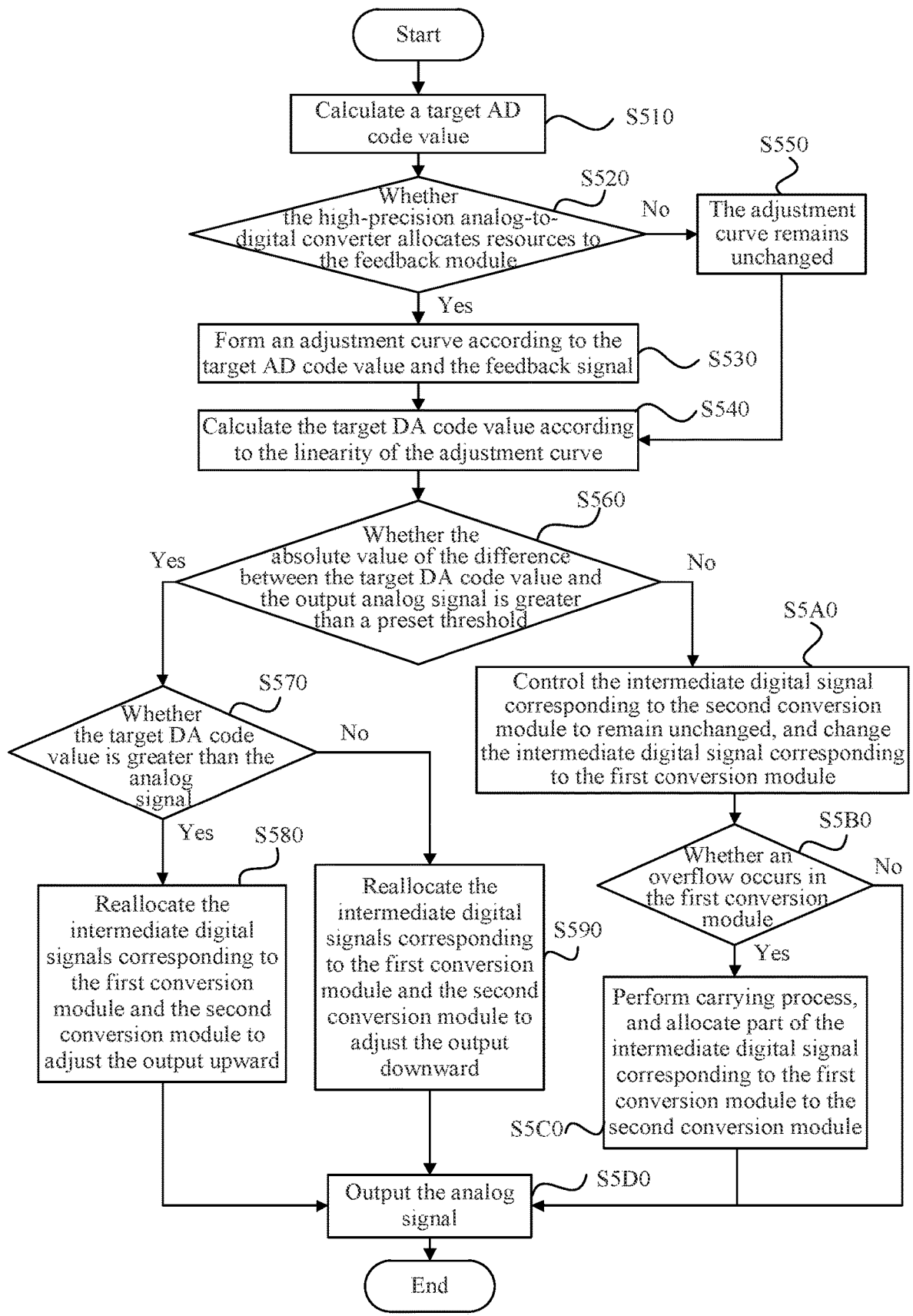
FIG. 9 is a schematic flowchart of another high-precision digital-to-analog conversion method according to an embodiment of the present application.

FIG. 9 is a schematic flowchart of another high-precision digital-to-analog conversion method according to an embodiment of the present application. With reference to FIG. 9 and FIG. 2, an embodiment is described with reference to an example in which the conversion device includes two conversion modules 120.

The high-precision digital-to-analog conversion method includes the following steps.

In S510, a target AD code value is calculated.

The target AD code value is the target digital signal for the feedback module 140.

In S520, it is determined whether the high-precision analog-to-digital converter allocates resources to the feedback module; if the high-precision analog-to-digital converter allocates resources to the feedback module, S530 is performed; and if the high-precision A/D converter does not allocate resources to the feedback module, S550 is performed.

The feedback module 140 is not working in real time because the feedback module 140 employs the surplus resources of the high-precision analog-to-digital converter 10.

In S530, an adjustment curve is formed according to the target AD code value and the feedback signal.

In S540, the target DA code value is calculated according to the linearity of the adjustment curve.

The target DA code value is an adjustment analog signal.

In S550, the adjustment curve remains unchanged.

When the feedback module 140 is not working, the adjustment curve is temporarily unchanged.

In S560, it is determined whether the absolute value of the difference between the target DA code value and the output analog signal is greater than a preset threshold; if the absolute value of the difference between the target DA code value and the output analog signal is greater than the preset threshold, S570 is performed; and if the absolute value of the difference between the target DA code value and the output analog signal is not greater than the preset threshold, S5A0 is performed.

In S570, it is determined whether the target DA code value is greater than the analog signal; if the target DA code value is greater than the analog signal, S580 is performed; and if the target DA code value is not greater than the analog signal, S590 is performed.

In S580, the intermediate digital signals corresponding to the first conversion module and the second conversion module are reallocated to adjust the output upward.

In S590, the intermediate digital signals corresponding to the first conversion module and the second conversion module are reallocated to adjust the output downward.

In S5A0, the intermediate digital signal corresponding to the second conversion module is controlled to remain unchanged, and the intermediate digital signal corresponding to the first conversion module is changed.

In S5B0, it is determined whether an overflow occurs in the first conversion module; if the overflow occurs in the first conversion module, S5C0 is performed; and if the overflow does not occur in the first conversion module, S5D0 is performed.

In S5C0, carrying process is performed, and part of the intermediate digital signal corresponding to the first conversion module is allocated to the second conversion module.

In order to reduce the overflow, the amount allocated to the second conversion module 120-2 may be slightly greater than the amount overflowed from the first conversion module 120-1, thus, more adjustment headroom may be reserved for the first conversion module 120-1, and only the first conversion module 120-1 is used for adjustment as far as possible when the target value is approached.

In S5D0, an analog signal is output.

With the conversion method provided in the above-described embodiments, high precision and high linearity of a high resolution (e.g., 16-bit) digital-to-analog converter can be achieved by using two low resolution (e.g., 12-bit) digital-to-analog converters. The output response time (reaching 99.99%) can be less than 10 ms, but only a small number of analog devices are required in hardware. Performance close to a high-precision digital-to-analog conversion chip can be achieved at the cost of a PWM scheme.

What is claimed is:

1. A digital-to-analog conversion device, comprising: a control module, n conversion modules, an adder and a feedback module; wherein n is an integer greater than or equal to 2, each of the n conversion modules comprises one conversion coefficient, and n conversion coefficients comprised in the n conversion modules increase progressively;

the control module is electrically connected to the n conversion modules; the control module is configured to: split an input digital signal into n intermediate digital portions, divide each of the n intermediate digital portions by a conversion coefficient of a conversion module corresponding to the each of the n intermediate digital portions to obtain n intermediate digital signals, and transmit the n intermediate digital signals to the n conversion modules which are in one-to-one correspondence with the n intermediate digital signals; wherein the n intermediate digital portions increase progressively;

each of the n conversion modules is configured to perform digital-to-analog conversion on an intermediate digital signal corresponding to the each of the n conversion modules, wherein a converted result of the intermediate digital signal comprises the conversion coefficient of each of the n conversion modules;

the n conversion modules are each electrically connected to the adder; and the adder is configured to add up output signals of the n conversion modules to obtain an analog signal and output the analog signal; and the feedback module is configured to collect the analog signal and obtain a feedback signal according to the analog signal; and the control module is further configured to acquire the feedback signal, and adjust allocation of the n intermediate digital portions according to a target digital signal and the feedback signal.

2. The digital-to-analog conversion device of claim 1, wherein each of the n conversion modules comprises a digital-to-analog (DA) conversion unit and a coefficient unit;

an input terminal of the DA conversion unit is electrically connected to the control module, and the DA conversion unit is configured to perform the digital-to-analog conversion on the intermediate digital signal corresponding to the each of the n conversion modules to obtain an intermediate analog signal; and an output terminal of the DA conversion unit is electrically connected to the coefficient unit, the coefficient unit comprises the conversion coefficient of the each of the n conversion modules, and the coefficient unit is configured to multiply the intermediate analog signal by the conversion coefficient of the each of the n conversion modules.

3. The digital-to-analog conversion device of claim 2, wherein the coefficient unit comprises a first resistor and a second resistor; and a first terminal of the first resistor is electrically connected to the DA conversion unit, a second terminal of the first resistor is electrically connected to the adder; a first terminal of the second resistor is electrically connected to the second terminal of the first resistor, and a second terminal of the second resistor is configured to be grounded.

4. The digital-to-analog conversion device of claim 1, wherein the feedback module is integrated in a high-precision analog-to-digital converter and is configured to employ redundant resources of the high-precision analog-to-digital converter.

5. A digital-to-analog conversion method, comprising:
splitting, by a control module of a digital-to-analog conversion device, an input digital signal into n intermediate digital portions; dividing each of the n intermediate digital portions by a conversion coefficient of a conversion module, corresponding to the each of the n intermediate digital portions, of the digital-to-analog conversion device to obtain an intermediate digital signal; and transmitting n intermediate digital signals to n conversion modules which are in one-to-one correspondence with the n intermediate digital signals respectively; wherein the n intermediate digital portions increase progressively, and N is an integer greater than or equal to 2;
receiving, by each of the n conversion modules, an intermediate digital signal corresponding to the each of the n conversion modules, and performing digital-to-analog conversion according to the intermediate digital signal; wherein each of the n conversion modules comprises one conversion coefficient, n conversion coefficients comprised in the n conversion modules increase progressively; and a converted result of the intermediate digital signal comprises the conversion coefficient of each of then conversion modules;
adding up, by an adder of the digital-to-analog conversion device, output signals of the n conversion modules to obtain an analog signal;
collecting, by a feedback module of the digital-to-analog conversion device, the analog signal, and obtaining a feedback signal according to the analog signal; and
acquiring, by the control module, the feedback signal, and adjusting allocation of the n intermediate digital portions according to a target digital signal and the feedback signal.

6. The digital-to-analog conversion method of claim 5, before splitting, by the control module of the digital-to-analog conversion device, the input digital signal into the n intermediate digital portions, further comprising:
acquiring the target digital signal.

7. The digital-to-analog conversion method of claim 5, wherein adjusting, by the control module, the allocation of the n intermediate digital portions according to the target digital signal and the feedback signal comprises:
controlling the digital-to-analog conversion device to output a first analog signal; collecting, by the feedback module, the first analog signal to obtain a first feedback signal; and establishing a first coordinate point composed of the first analog signal and the first feedback signal;
controlling the digital-to-analog conversion device to output a second analog signal; collecting, by the feedback module, the second analog signal to obtain a second feedback signal; and establishing a second coordinate point composed of the second analog signal and the second feedback signal;
obtaining a reference correction line according to the first coordinate point and the second coordinate point;
adjusting, according to the target digital signal and the feedback signal, the reference correction line through proportional-integral-differential (PID) adjustment to form an adjustment curve; and
adjusting the allocation of then intermediate digital portions according to the adjustment curve.

8. The digital-to-analog conversion method of claim 7, wherein adjusting the allocation of the n intermediate digital portions according to the adjustment curve comprises:
taking the target digital signal as a target feedback signal and taking an analog signal which is on the adjustment curve and corresponds to the target feedback signal as an adjustment analog signal;
setting $(n-1)$ hopping thresholds, determining progressively, downward from an $(n-1)^{th}$ hopping threshold, whether an absolute value of a difference between the adjustment analog signal and the analog signal is greater than a current hopping threshold, and setting an adjustment strategy; wherein the $(n-1)$ hopping thresholds increase progressively.

9. The digital-to-analog conversion method of claim 8, wherein setting the adjustment strategy comprises:
in response to the absolute value of the difference between the adjustment analog signal and the analog signal being greater than an $i^{th}$ hopping threshold, setting the adjustment strategy as follows: allocating a first part of the absolute value to an $(i+1)^{th}$ conversion module, and allocating a second part of the absolute value to first i conversion modules; wherein $1 \leq i \leq (n-1)$, and the first part of the absolute value and the second part of the absolute value constitute the absolute value; or
in response to the absolute value of the difference between the adjustment analog signal and the analog signal being less than or equal to the $i^{th}$ hopping threshold, determining whether the absolute value is greater than a total adjustable threshold of the first i conversion modules; and
in response to the absolute value being not greater than the total adjustable threshold of the first i conversion modules, setting the adjustment strategy as follows: setting a total adjustment amount for the first i conversion modules as the absolute value.

10. The digital-to-analog conversion method of claim 9, after determining whether the absolute value is greater than the total adjustable threshold of the first i conversion modules, further comprising:
in response to the absolute value being greater than the total adjustable threshold of the first i conversion modules, setting the adjustment strategy as follows: allocating a part of the absolute value exceeding the total adjustable threshold to the $(i+1)^{th}$ conversion module for adjustment, and allocating a remaining part of the absolute value to the first i conversion modules for adjustment.

* * * * *